(12) United States Patent
Park et al.

(10) Patent No.: US 7,087,985 B2
(45) Date of Patent: Aug. 8, 2006

(54) NITRIDE SEMICONDUCTOR LIGHT EMITTING DEVICE

(75) Inventors: Young Ho Park, Kyungki-do (KR); Hyo Kyoung Cho, Kyungki-do (KR); Seung Jin Yoo, Kyungki-do (KR); Kun Yoo Ko, Seoul (KR)

(73) Assignee: Samsung Electro-Mechanics Co., Ltd., Kyungki-do (KR)

( * ) Notice: Subject to any disclaimer, the term of this patent is extended or adjusted under 35 U.S.C. 154(b) by 0 days.

(21) Appl. No.: 10/853,236

(22) Filed: May 26, 2004

(65) Prior Publication Data

US 2005/0133807 A1 Jun. 23, 2005

(30) Foreign Application Priority Data

Dec. 18, 2003 (KR) .................. 10-2003-0093091

(51) Int. Cl.
*H01L 23/495* (2006.01)

(52) U.S. Cl. ........................ 257/676; 257/99

(58) Field of Classification Search ............. 257/676, 257/99; 362/555
See application file for complete search history.

(56) References Cited

U.S. PATENT DOCUMENTS 6,307,218 B1  10/2001  Steigerwald et al.

FOREIGN PATENT DOCUMENTS

| JP | 2001-237461 | 8/2001 |
| JP | 2001-308380 | 11/2001 |

*Primary Examiner*—Douglas W Owens
(74) *Attorney, Agent, or Firm*—Lowe Hauptman & Berner, LLP

(57) ABSTRACT

In a nitride semiconductor LED having a light emitting structure, an n-doped semiconductor layer has a first region and a second region surrounding the first region, an active layer is formed on the second region of the n-doped semiconductor layer, and a p-doped nitride semiconductor layer is formed on the active layer. A p-electrode is formed on the p-doped semiconductor layer. An n-electrode is formed on the first region of the n-doped nitride semiconductor layer.

20 Claims, 14 Drawing Sheets

NITRIDE SEMICONDUCTOR LIGHT EMITTING DEVICE

BACKGROUND OF THE INVENTION

1. Field of the Invention

The present invention relates to a nitride semiconductor light emitting diode, and more particularly, a large-sized high efficiency nitride semiconductor light emitting diode which can be used suitably in a high power lighting system.

2. Description of the Related Art

As well known in the art, nitride semiconductors in the form of III-V group semiconductor crystals such as GaN, InN and AlN are widely used in Light Emitting Diodes (LEDs) for emitting single wavelength light (e.g., ultraviolet ray and green light), in particular, blue light. Because a nitride semiconductor LED is fabricated on an insulation substrate such as a sapphire substrate and a SiC substrate satisfying lattice matching conditions for crystal growth, it necessarily has a planar structure in which two electrodes connected to p- and n-doped nitride semiconductor layers are arranged substantially horizontally on the top of a light emitting structure.

A planar LED has drawbacks that an effective light emitting area is not sufficient and luminous efficiency per light emitting area is low because the flow of electric current is not uniformly distributed across the light emitting area unlike a vertical LED in which both electrodes are arranged on the top and the bottom of its light emitting structure. An example of the planar LED and the restricted luminous efficiency will be described with reference to FIGS. 1a and 1b.

FIGS. 1a and 1b illustrate an example of a conventional nitride semiconductor LED 10.

The nitride semiconductor LED 10 shown in FIG. 1a has p- and n-electrodes 19 and 18 both of which are arranged in diagonal corners on the top of a substantially rectangular LED body. Then, the conventional nitride semiconductor LED 10 has a planar structure with the p- and n-electrodes 19 and 18 being horizontally arranged side by side.

Describing it in more detail with reference to FIG. 1b illustrating a longitudinal section taken across a line A–A' in FIG. 1a, the nitride semiconductor LED 10 has an n-doped nitride semiconductor layer 12, an active layer 14 and a p-doped nitride semiconductor layer 16 formed on the substrate 11 one atop another in their order on a sapphire substrate 11. As in this illustration, the p-doped nitride semiconductor layer 16 may be covered with a transparent electrode layer 17 such as tin-doped indium oxide or Indium Tin Oxide (ITO) in order to improve contact resistance.

Because the sapphire substrate 11 in use for the formation or growth of the nitride semiconductor layers is electrically insulated as described above, both the p-doped nitride semiconductor layer 16 and the active layer 14 are partially removed to form the n-electrode 18 that is to be connected to the n-doped nitride semiconductor layer 12. Owing to the electrical insulation of the substrate for growing the nitride semiconductor, the nitride semiconductor LED 10 has the planar structure with the p- and n-electrodes 19 and 18 being arranged on the same side.

In the planar semiconductor LED 10 shown in FIGS. 1a and 1b, current flow is concentrated on the shortest path between the both electrodes to narrow the current path which current density is concentrated on unlike the vertical LED allowing vertical current flow. Also, the current flow is directed laterally to increase drive voltage owing to large series resistance, resultantly reducing actual light emitting area. That is, the nitride semiconductor LED has drawbacks of low current density per unit area originated from limitations of the planar structure as well as low area efficiency owing to small light emitting area. As a result, it has been regarded very difficult to obtain a high power LED in use for lighting systems by a large-size (e.g., 1000×1000 µm).

In order to alleviate these problems, various forms of conventional approaches such as p- and n-electrode configurations and arrangements for raising current density and area efficiency have been developed as shown in FIGS. 2 to 3b.

FIG. 2 is a plan view of an LED having an n-doped nitride semiconductor 22, an active layer and a p-doped nitride semiconductor layer (not shown) which are laid on a substrate one atop another in their order. On the top of the LED, p- and n-electrodes 29 and 28 are formed, connected to the p-doped nitride semiconductor layer (or a transparent electrode layer 27 if any) and the n-doped nitride semiconductor layer 22. The n-electrode 28 includes two contact pads 28a and a number of electrode fingers 28b extended from the contact pads 28a, respectively, and the p-electrode 29 includes two contact pads 29a and a number of electrode fingers 29b extended from the contact pads 29a, respectively, in which the n-electrode fingers 28b alternate with the p-electrode fingers 29b. This electrode structure can provide separate current paths through the electrode fingers 28b and 29b to reduce the lateral mean distance between the electrodes. This as a result can reduce series resistance, improve the uniformity of electric density across the whole area as well as ensure a sufficient light emitting area to the entire top surface even in case of a large-sized LED.

However, there is a problem that distal ends of the respective electrode fingers 28b and 29b show a lower optical power than other proximal portions thereof because they are placed substantially away from the contact pads 28a and 29a through which electric current is introduced.

FIGS. 3a and 3b illustrate a nitride semiconductor LED 30 having another conventional electrode structure. Referring to FIG. 3a, a p-electrode 39 includes a contact pad 39a formed in a substantially central area on the top of the LED 30 and four electrode fingers 39b extended from the contact pad 39a in diagonal directions. An n-electrode 38 includes a contact pad 38a formed adjacent to a corner on the top of the LED 30, an extension 38b extended from the contact pad 38a along adjacent to the outer periphery to surround the p-electrode 39 and four electrode fingers 38c extended from the extension 38b toward the p-electrode contact pad 39a.

As shown in FIG. 3b, the nitride semiconductor LED 30 has a light emitting structure which includes an n-doped nitride semiconductor layer 32, an active layer 34 and a p-doped nitride semiconductor layer 36 formed on a substrate 31 one atop another in their order. On the top of the light emitting structure, a transparent electrode 37 may be formed on the p-doped nitride semiconductor 36 to improve the contact resistance with the p-electrode 38. Herein, both the n-electrode contact pad 38a and the n-electrode extension and 38b are formed on the n-doped nitride semiconductor layer 32 exposed along the outer periphery of the LED 30, and both the p-electrode contact pad 39a and the p-electrode fingers 39b are formed on the transparent electrode 37 and electrically connected to a p-doped nitride cladding layer 37.

In the nitride semiconductor LED 30 shown in FIGS. 3a and 3b, because the contact pads and terminals of other electrode regions are formed shorter than in the structure shown in FIG. 2 and the both electrodes are distributed at a uniform gap across the entire area, series resistance can be reduced to improve luminous efficiency and current density can be distributed uniformly.

However, because the active layer is removed by a considerable amount in order to form the n-electrode, this electrode structure also has drawbacks in that actual light emitting area is remarkably reduced with respect to the whole size of the originally grown light emitting structure and luminous efficiency per unit area is degraded on the contrary according to the size growth of the LED.

As a consequence, novel electrode structures and arrangements for ensuring higher power to large-sized nitride semiconductor LEDs have been incessantly searched in the art.

SUMMARY OF THE INVENTION

Therefore the present invention has been made to solve the foregoing problems of the prior art.

It is an object of the present invention to provide a nitride semiconductor LED which has an n-electrode arranged in an inner area on the top of the LED and a p-electrode arranged surrounding the n-electrode in order to realize a geometry capable of ensuring larger effective light emitting area while ensuring more effective current distribution.

According to an aspect of the invention for realizing the object, there is provided a nitride semiconductor LED comprising: a light emitting structure including an n-doped semiconductor layer having a first region and a second region surrounding the first region on a top thereof, an active layer formed on the second region of the n-doped semiconductor layer and a p-doped nitride semiconductor layer formed on the active layer; a p-electrode formed on the p-doped semiconductor layer; and an n-electrode formed on the first region of the n-doped nitride semiconductor layer.

Preferably, the first region on the top of the n-doped nitride semiconductor layer may correspond to a substantially central area of the n-doped nitride semiconductor layer, and the n-electrode may be formed in the central area.

The nitride semiconductor LED may further comprise a transparent electrode layer for reducing the contact resistance between the p-doped nitride semiconductor layer and the p-electrode.

Preferably, the p-electrode may have at least one contact pad and at least one extension extended from the contact pad along an outer periphery of the p-doped nitride semiconductor layer, and the p-electrode may be formed to surround the n-electrode.

According to a more preferred embodiment, the light emitting structure may have four corners and four sides each for connecting adjacent corners on the top thereof, and the p-electrode may have at least one contact pad placed adjacent to at least one of the four corners and an extension extended from the contact pad along the four sides.

In this embodiment, the p-electrode can be modified into various forms. That is, the p-electrode may further comprise at least one p-electrode finger extended from the contact pad and/or the extension toward the n-electrode. Also, the p-electrode further may have an electrode bar extended in a lateral direction from a terminal of at least one of the p-electrode finger to a predetermined length.

Similarly, the n-electrode of the invention can be modified into various forms.

Preferably, the n-electrode may include a contact pad formed on a substantially central area of the n-doped nitride semiconductor layer and at least one n-electrode finger extended outward from the contact pad on the n-doped nitride semiconductor layer.

In an embodiment that the light emitting structure has four corners and four sides each for connecting adjacent corners on the top thereof, the n-electrode finger may comprise four electrode fingers extended toward four corners, respectively. Also, the n-electrode may further have an electrode bar formed in a lateral direction at a terminal of at least one of the n-electrode finger at a predetermined length.

According to another aspect of the invention for realizing the object, there is provided a nitride semiconductor LED comprising: a light emitting structure including an n-doped nitride semiconductor layer, an active layer and a p-doped semiconductor layer which are laid one atop another in their order; a p-electrode including at least one contact pad formed in a predetermined area on the p-doped nitride semiconductor layer and an extension extended from the contact pad along the outer periphery on the n-doped nitride semiconductor layer; and an n-electrode including at least one contact pad formed in a predetermined area on the n-doped nitride semiconductor layer surrounded by the p-electrode.

In this embodiment, the area on the n-doped nitride semiconductor layer surrounded by the p-electrode may be divided into a plurality of equal-sized sub-areas, and the contact pad of the n-electrode may comprise a plurality of contact pads which are arranged in substantially central portions of the plurality of sub-areas, respectively. Then, the n-electrode may further include an extension extended between the contact pads and/or from the contact pads toward the p-electrode. Also, the n-electrode extension may connect at least some of the n-electrode contact pads together.

DETAILED DESCRIPTION OF THE PREFERRED EMBODIMENT

Preferred embodiments of the present invention will now be described in detail with reference to the accompanying drawings.

Figure 4A:
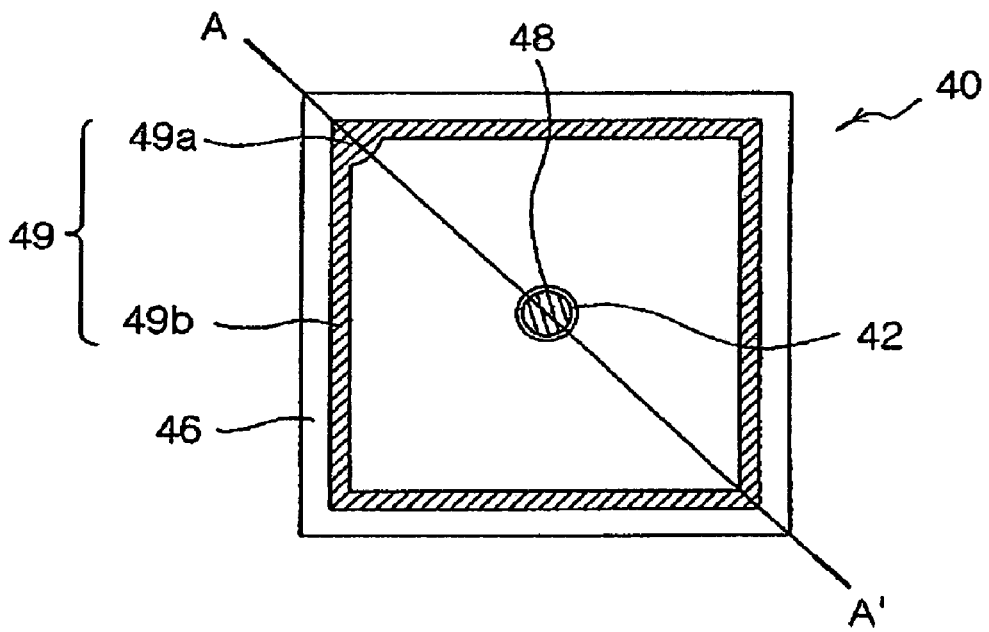
FIGS. 4a and 4b are plan and side sectional views illustrating a nitride semiconductor LED according to an embodiment of the invention.
Figure 4B:
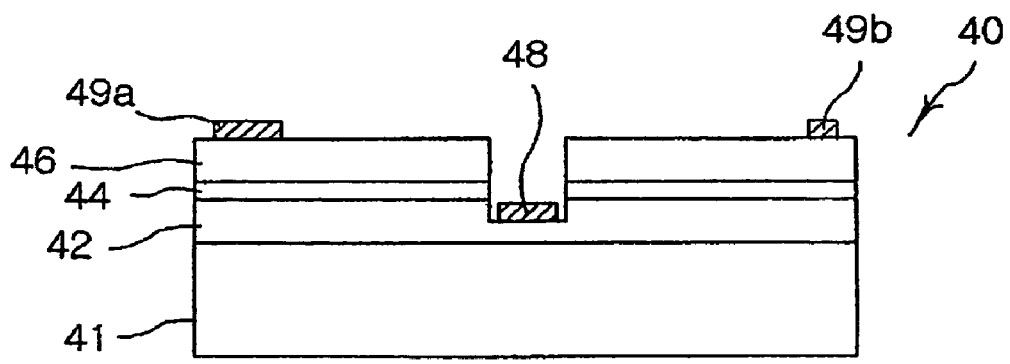

FIGS. 4a and 4b are plan and side sectional views illustrating a nitride semiconductor LED according to an embodiment of the invention.

Referring to FIG. 4a, it is depicted an LED 40 having an n-electrode 48 and a p-electrode 49 formed on the top thereof. The n-electrode 48 is formed on a predetermined area of an n-doped nitride semiconductor layer 42. The predetermined area for the n-electrode 48 is defined to an inner area of the n-doped semiconductor layer 42 surrounded by the active layer 44 and the p-doped nitride semiconductor layer 46. The n-electrode 48 may preferably be of a contact pad formed on a central area of the n-doped nitride semiconductor layer 42 as in this embodiment.

The p-electrode 49 is formed on the p-doped nitride semiconductor layer 46, and includes a contact pad 49a formed at a corner of the p-doped nitride semiconductor layer 46 and an extension 49b extended from the contact pad 49a along adjacent to the outer periphery of the top. In particular, the extension 49b of the p-electrode 49 may be so formed to completely surround the n-electrode 48 as shown in FIG. 4a. While this embodiment illustrates that the p-electrode 49 is in direct contact on the p-doped nitride semiconductor layer 46, a transparent electrode layer for reducing contact resistance may be formed between the p-electrode 49 and the p-doped nitride semiconductor layer 46 in a number of actual applications. The p-electrode 49 is also called a p-bonding electrode.

Like this, the nitride semiconductor LED 40 of the invention provides a novel electrode arrangement of the n-electrode 48 formed in the inner area on the n-doped nitride semiconductor layer 42 and the p-electrode 49 formed on the nitride semiconductor layer 46 surrounding the n-electrode 48.

Figure 3A:
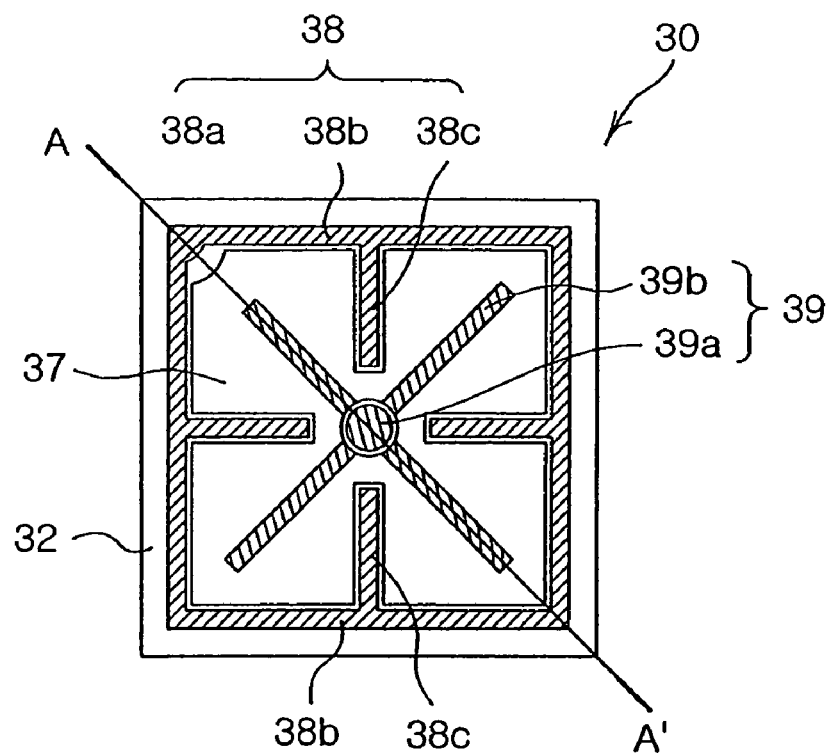
FIGS. 3a and 3b are plan and side sectional views illustrating another example of a conventional nitride semiconductor LED.
Figure 3B:
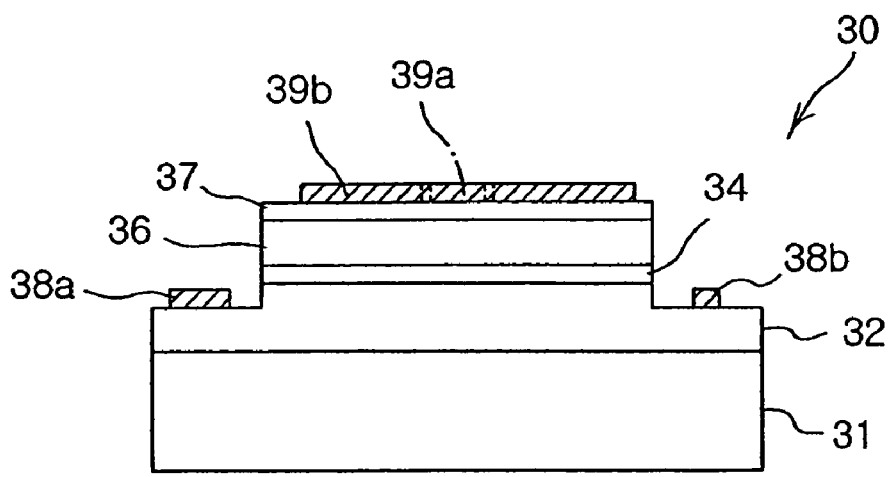

The inventors found that the n- and p-electrodes 48 and 49 arranged reversely to the electrode structure shown in FIG. 3a can reduce the removal of the active area, which is induced from the geometry of the electrode structure in FIG. 3a, to increase actual light emitting area as well as improve current distribution effect and forward voltage characteristics thereby raising actual luminous efficiency.

Describing it in more detail, the light emitting area of the invention can be increased based upon a novel geometric arrangement structure obtained by placing the n-electrode in an inner area to reduce the removal of the active layer, which is necessary for the formation of the n-electrode, and the p-electrode around the n-electrode. That is, in the nitride semiconductor LED, both the p-doped nitride semiconductor layer and the active layer are to be selectively removed from predetermined areas, in which the n-electrode will be formed, by smaller amounts if the n-electrode is placed inside rather than outside in view of the geometric structure, thereby reducing the area of the active layer to be removed. Improved forwarding voltage characteristics and entire luminous efficiency enhanced thereby as another effects of the invention will be described later in more detail with reference to FIGS. 9a to 12c.

The LED structure of this embodiment shown in FIG. 4a may adopt various electrode structure modifications within the scope of the invention as set forth above in order to distribute current more uniformly between the both electrodes.

Figure 5A:
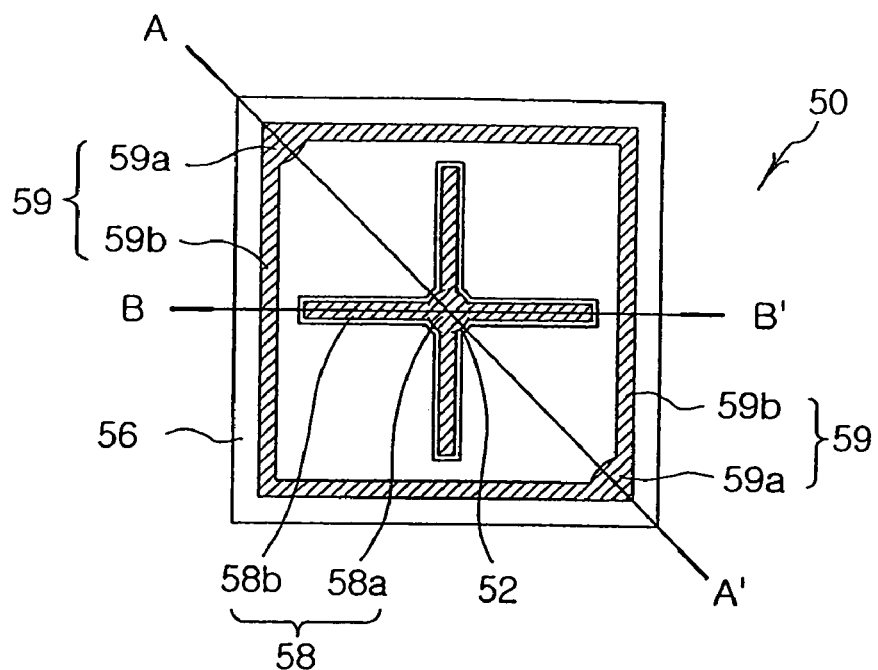
FIGS. 5a to 5c are plan and side sectional views illustrating a nitride semiconductor LED according to an alternate embodiment of the invention.
Figure 5B:
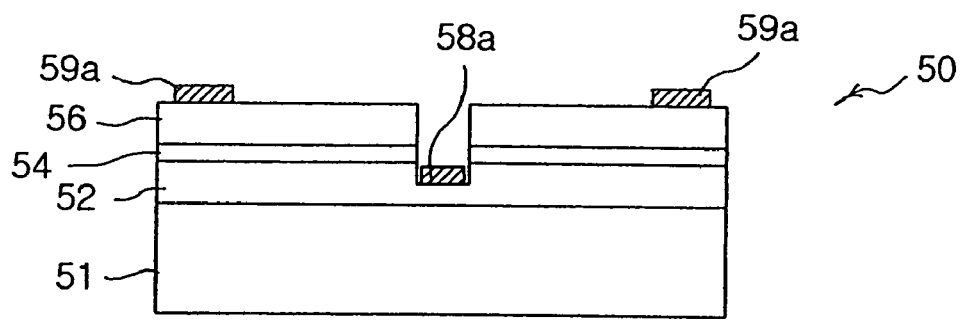
Figure 5C:
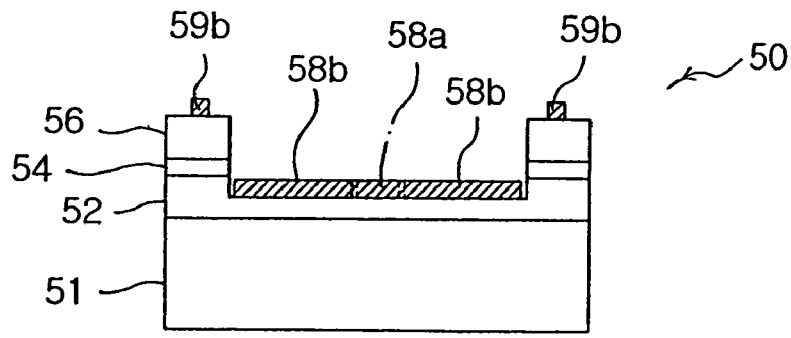

FIGS. 5a to 5c are plan and side sectional views illustrating a nitride semiconductor LED according to an alternate embodiment of the invention, in which an n-electrode is modified to realize more effective current distribution.

Referring to FIG. 5a, it is depicted an LED 50 having an n-electrode 58 and a p-electrode 59 formed on the top thereof. The n-electrode 58 includes a contact pad 58a formed on a central area of an n-doped nitride semiconductor layer 52 and four electrode fingers 58b extended from the contact pad 58a. The p-electrode 59 includes two contact pad 59a formed at two opposed corners and extensions 59b formed along adjacent to the outer periphery of the top. As shown in FIGS. 5b and 5c, the n-electrode 58 is formed in the central area of the n-doped nitride semiconductor layer 52, and the p-electrode 59 is formed along adjacent to the outer periphery of the p-doped nitride semiconductor 56. In the LED 50 of this embodiment, although the both contact pads 59a may be connected to an external circuit via wire bonding or flip chip bonding, one of the contact pads 59a may be selectively connected to the external circuit.

The extensions 59b of the p-electrodes 59 may be formed to surround the n-electrode 58 completely as shown in FIG. 5a. In this embodiment shown in FIG. 5a, the n-electrode fingers 58b are extended from the n-electrode contact pad 58a toward central portions of four sides of the extensions 58b of the p-electrode 59. The n-electrode fingers 58b are used as means for shortening the current path between the p-electrode 59 and the n-electrode 58 to decrease series resistance while ensuring more uniform current distribution across the whole light emitting area.

Figure 6A:
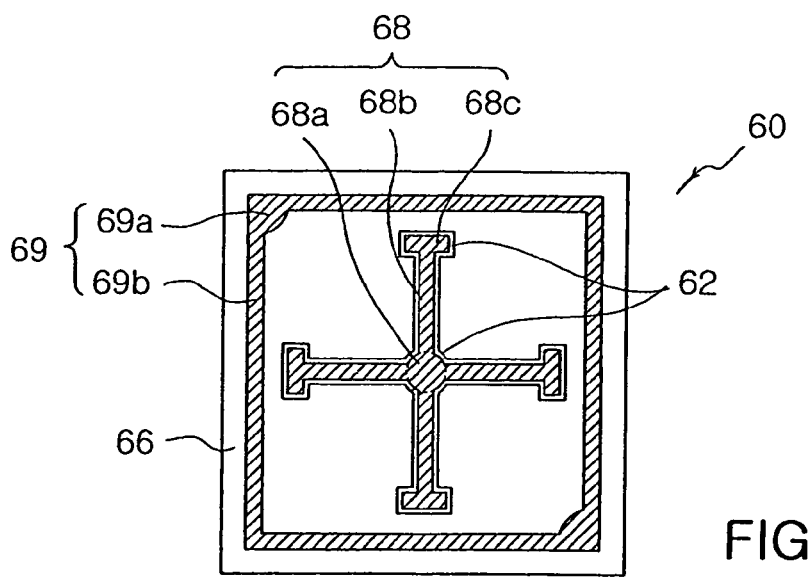
FIGS. 6a to 6c are plan views illustrating various modifications of n-electrode structures used in a nitride semiconductor LED according to the invention.
Figure 6B:
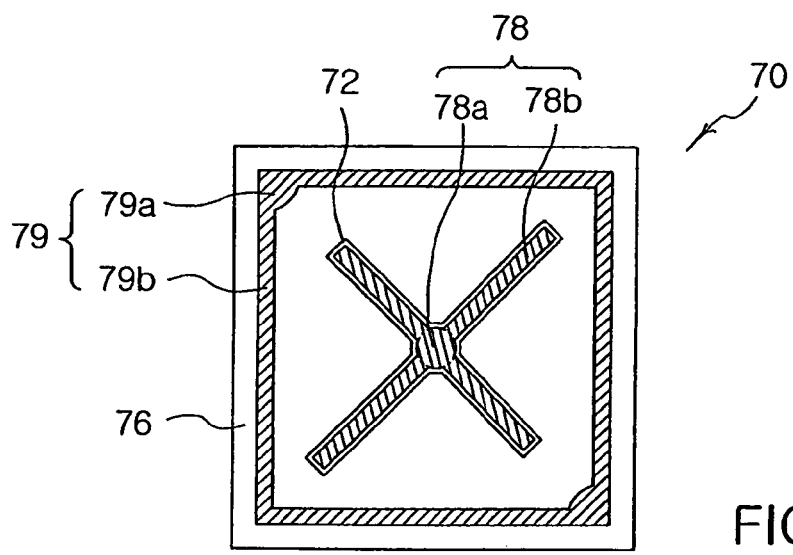
Figure 6C:
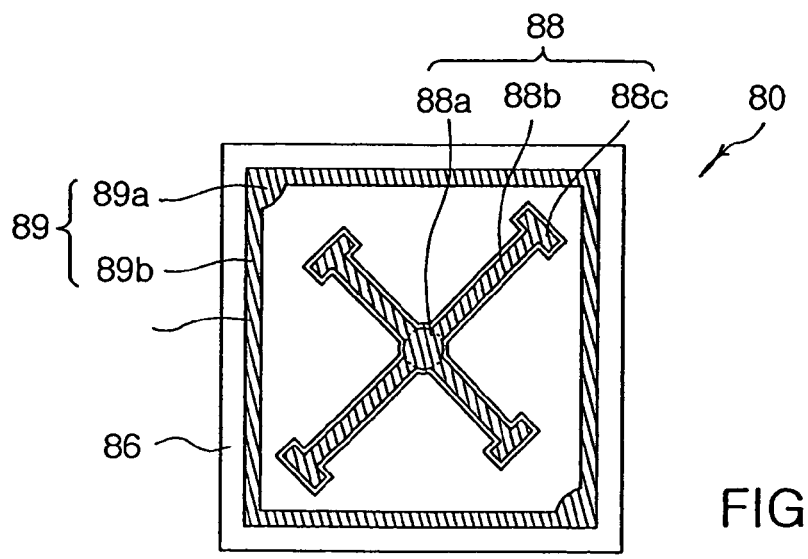

Because the n-electrode 58 is arranged on the central portion of the n-doped nitride semiconductor layer 52, the p-electrode 59 is arranged to surround the n-electrode 58, and the n-electrode fingers 58b are further formed in the n-electrode 59 to extend toward the sides of the light emitting structure, the current distribution effect can be further enhanced. The n-electrode can be modified into various forms in order to enhance the current distribution effect. FIGS. 6a to 6c are plan views illustrating various examples of n-electrode structures.

FIG. 6a illustrates an n-electrode structure similar to that shown in FIG. 5a except that electrode bars 68c are extended in lateral directions from terminals of n-electrode fingers 68b, respectively, to a predetermined length.

As shown in FIG. 6a, a nitride semiconductor LED 60 of this embodiment has an n-electrode 68 connected to an n-doped nitride semiconductor layer 62 and a p-electrode 69 connected to a p-doped nitride semiconductor layer 66 on the top thereof. The p-electrode 69 has two contact pad 69a formed at two opposed corners, respectively, and extensions 69b extended from the contact pads 69a along adjacent to the outer periphery of the top. The n-electrode 68 includes a contact pad 68a formed in a central area of the n-doped nitride semiconductor layer 62, four electrode fingers 68b extended from the contact pad 68a and electrode bars 68c extended in lateral directions from terminals of the electrode fingers 68b, respectively, to a predetermined length. The n-electrode bars 68c can be used as means for realizing uniform current distribution across the entire light emitting area while shortening the current path between the n- and p-electrodes 68 and 69 as the electrode fingers 68*b*.

FIG. 6*b* illustrates an n-electrode structure having four n-electrode fingers 78*b* similar to those shown in FIG. 5*a* except that the electrode fingers 78*b* have different orientations.

A nitride semiconductor LED 70 shown in FIG. 6*b* has an n-electrode 78 connected to an n-doped nitride semiconductor layer 72 and a p-electrode 79 connected to a p-doped nitride semiconductor layer 76 on the top thereof. The p-electrode 79 includes two contact pads 79*a* formed at two opposed corners, respectively, and extensions 79*b* extended from the contact pads 79*a* along adjacent to the outer periphery on the top. The n-electrode 78 includes a contact pad 78*a* formed in a central area of the n-doped nitride semiconductor layer 72 and four electrode fingers 78*b* extended from the contact pad 78*a* toward the corners. The n-electrode fingers 78*b* extended toward the corners on the p-doped nitride semiconductor layer 76 can be adopted as means for realizing uniform current distribution across the entire light emitting area while shortening the current path as the p-electrode fingers 59*b* shown in FIG. 5*b*. As in this embodiment, the n-electrode fingers 78*b* extended toward the corners of p-nitride semiconductor layer 76 may be of different lengths. In view of more uniform current distribution, one pair of the n-electrode fingers 78*b* directed toward the p-electrode contact pads 79*a* are preferably formed shorter than the other pair of the n-electrode fingers 78*b*.

FIG. 6*c* illustrates an n-electrode structure modified from that shown in FIG. 6*b*, in which electrode bars 88*c* are formed in lateral directions at terminals of n-electrode fingers 88*b* at a predetermined length.

A nitride semiconductor LED 80 shown in FIG. 6*c* has an n-electrode 88 connected to an n-doped nitride semiconductor layer 82 and a p-electrode 89 connected to a p-doped nitride semiconductor layer 86 on the top thereof. The p-electrode 89 includes two contact pads 89*a* formed at two opposed corners, respectively, and extensions 89*b* extended from the contact pads 89*a* along adjacent to the upper outer periphery of the p-doped nitride semiconductor layer 86. The n-electrode 88 includes a contact pad 88*a* formed in a central area of the n-doped nitride semiconductor layer 82, four electrode fingers 88*b* extended from the contact pad 88*a* and the electrode bars 88*c* formed in lateral directions at terminals of the electrode fingers 88*b*, respectively, at a predetermined length.

Figure 7A:
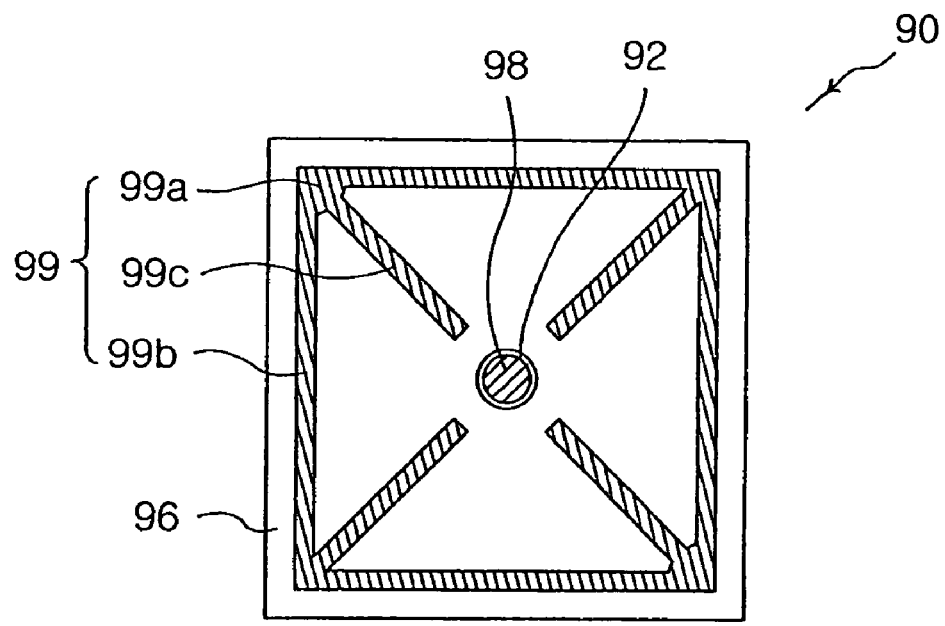
FIGS. 7a and 7b are plan views illustrating various modifications of p-electrode structures used in a nitride semiconductor LED according to the invention.
Figure 7B:
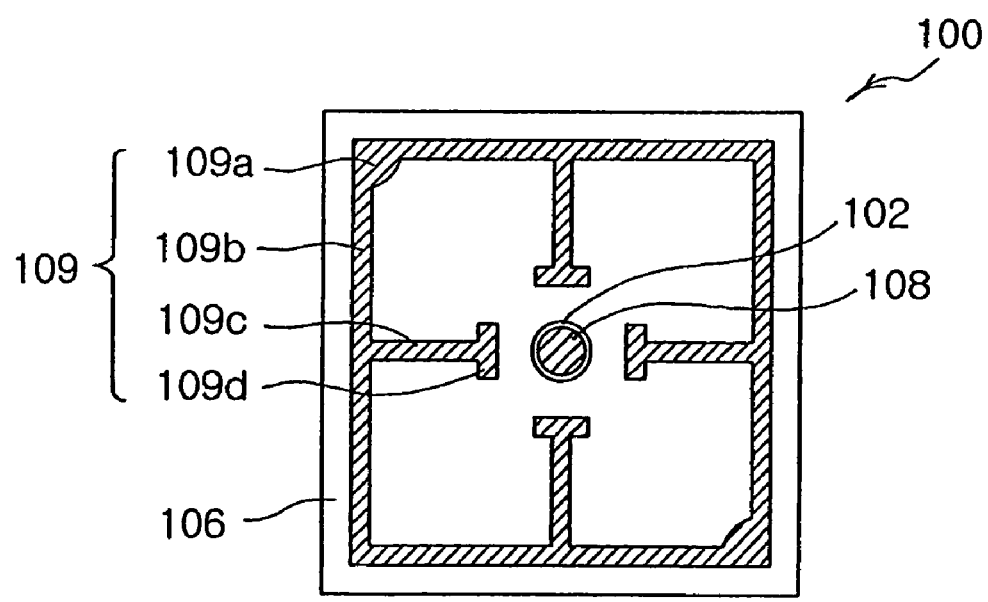

Alternatively, the present invention can modify the p-electrode structure in replacement of the n-electrode structure. FIGS. 7*a* and 7*b* illustrate another alternative embodiment of the invention with a modified p-electrode structure.

FIG. 7*a* illustrates an LED structure having four p-electrode fingers 98*b* extended toward an n-electrode 98 placed in the center.

A nitride semiconductor LED 90 shown in FIG. 7*a* has an n-electrode 98 connected to an n-doped nitride semiconductor layer 92 and a p-electrode 99 connected to a p-doped nitride semiconductor layer 96 on the top thereof. The n-electrode 98 is constituted of only a contact pad formed in a central area of the n-doped nitride semiconductor layer 92, whereas the p-electrode includes two contact pads 99*a* formed at two opposed corners, respectively, extensions 99*b* extended from the contact pads 99*a* along adjacent to the upper outer periphery of the p-doped nitride semiconductor layer 96 and four electrode fingers 99*c* extended from the corners toward the n-electrode 98, respectively. In this embodiment, the p-electrode fingers 99*c* are used as means for more uniformly distributing electric current across the entire light emitting area while shortening the current path as the afore-described n-electrode fingers.

FIG. 7*b* illustrates another LED structure having p-electrode fingers 109*c* different from that in FIG. 7*a*.

A nitride semiconductor LED 100 shown in FIG. 7*b* has an n-electrode 108 connected to an n-doped nitride semiconductor layer 102 and a p-electrode 109 connected to the p-doped nitride semiconductor layer 106 on the top thereof. The n-electrode 108 is constituted of only a contact pad formed in a central area of the n-doped nitride semiconductor layer 102, whereas the p-electrode 109 includes two contact pads 109*a* formed in two opposed corners, extensions 109*b* extended from the contact pads 109 along adjacent to the upper outer periphery of the p-doped nitride semiconductor layer 106 and four electrode fingers 109*c* extended from central portions of four sides of the extensions 109*b* toward the n-electrode 108. The p-electrode fingers 109*c* also have p-electrode bars 109*d* formed in lateral directions at terminals thereof, respectively, at a predetermined length. The electrode bars 109*d* can increase the current density between the n- and p-electrodes 108 and 109 at the terminals of the p-electrode fingers 109*c* to further enhance the overall luminous efficiency.

Figure 8A:
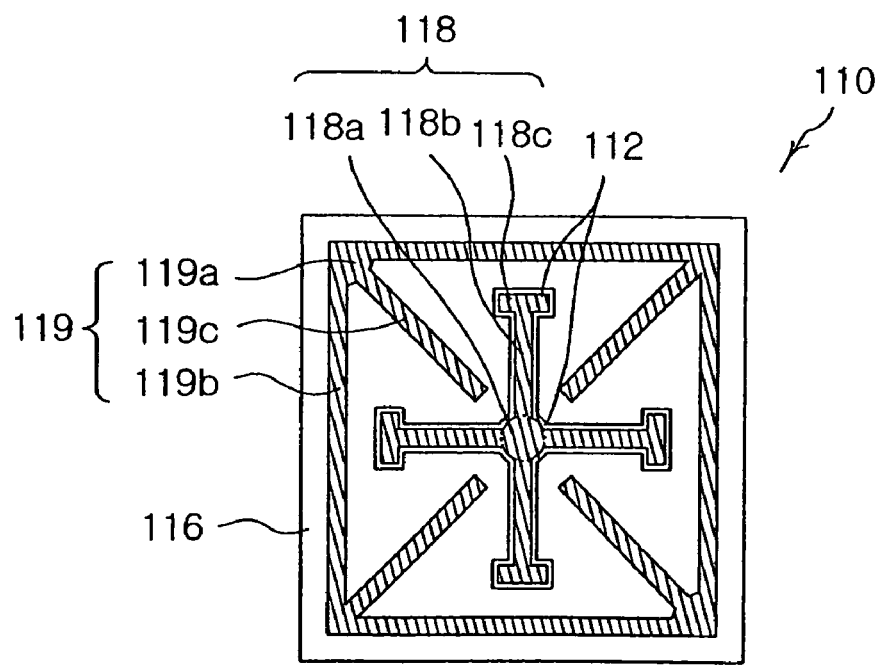
FIGS. 8a and 8b are plan views illustrating various modifications of p- and n-electrode structures in a nitride semiconductor LED according to the invention.
Figure 8B:
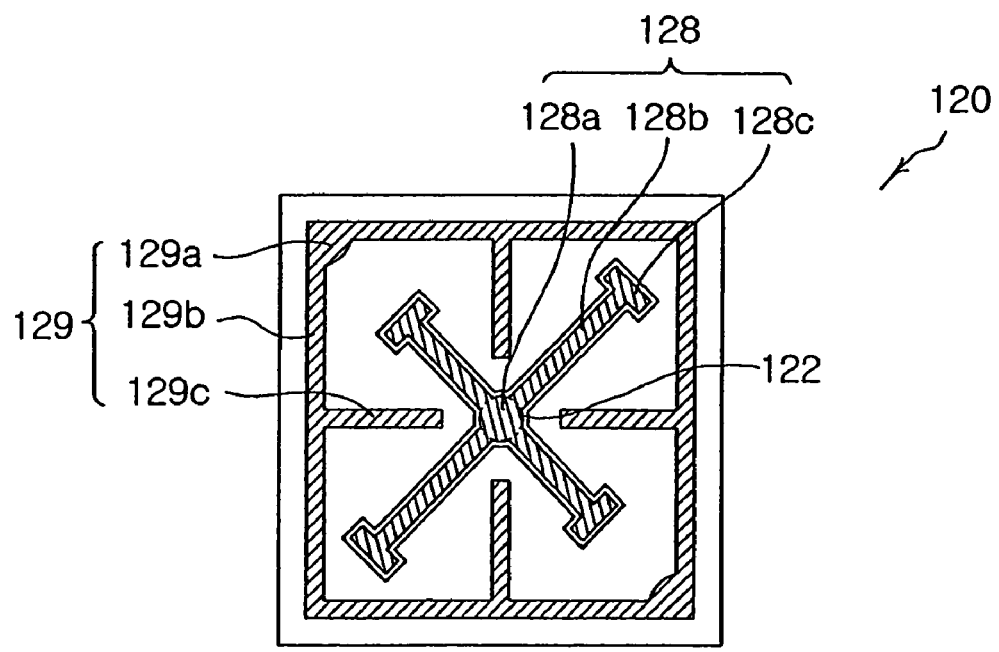

The present invention may provide additional embodiments by combining the two afore-described structures, that is, the n-electrode structure and the p-electrode structure. FIGS. 8*a* and 8*b* are plan views illustrating further another alternate embodiments with improved p- and n-electrode structures.

In a nitride semiconductor LED 110 shown in FIG. 8*a*, an n-electrode 118 includes a contact pad 118*a* formed in a central area of an n-doped nitride semiconductor layer 112, four electrode fingers 118*b* directed from the contact pad 118*a* toward central portions of sides, respectively, and electrode bars 118*c* formed in lateral directions at terminals of the electrode fingers 118, respectively. Also, a p-electrode 119 connected to a p-doped nitride semiconductor layer 116 includes two contact pads 119*a* formed in two opposed corners, extensions 119*b* extended from the contact pads 119*a* along adjacent to the upper outer periphery of the p-doped nitride semiconductor layer 116 and four electrode fingers 119*c* extended from the corners, respectively, toward the n-electrode contact pad 118*a*.

Describing the electrode structure of this embodiment in top view of a substantially rectangular light emitting structure, the p-electrode 119 has the electrode fingers 119*c* arranged in diagonal directions, and the n-electrode 118 has the electrode fingers 118*b* crossed into separate areas defined between the p-electrode fingers 119*c*. The n-electrode 118 also has electrode bars 118*c* formed in lateral directions at terminals of the electrode fingers 118, respectively, to shorten the current path to the p-electrode 119.

In a nitride semiconductor LED 120 shown in FIG. 8*b*, the n-electrode 128 includes a contact pad 128*a* formed in a central area of an n-doped nitride semiconductor layer 122, four electrode fingers 128*b* arranged from the contact pad 128*a* toward corners, respectively, and electrode bars 128*c* formed in lateral directions at terminals of the electrode fingers 128*b*. Further, a p-electrode 129 connected to a p-doped nitride semiconductor layer 126 includes two contact pads 129*a* formed at two opposed corners, respectively, extensions 129*b* extended from the contact pads 129*a* along adjacent to the outer periphery of the p-doped nitride semiconductor layer 126 and four electrode fingers 129*c* extended from the central portions of sides toward the n-electrode contact pads 128*a*, respectively.

Describing the electrode structure of this embodiment in top view of a substantially rectangular light emitting structure, the p-electrode 129 has the electrode fingers 129c, which are arranged in the form of a cross, and the n-electrode 128 includes the electrode fingers 128b, which are arranged in diagonal directions in separate areas defined between the p-electrode fingers 129c. Further, the n-electrode 128 also has the electrode bars 128c formed in lateral directions at the terminals of the electrode fingers 128b, respectively, to shorten the current path to the p-electrode 129.

EXAMPLE

In order to examine those improved characteristics of the nitride semiconductor LED of the invention, three nitride semiconductor LED structures were fabricated with same component and thickness on rectangular sapphire substrates of approximately 1000×1000 µm size.

Figure 1A:
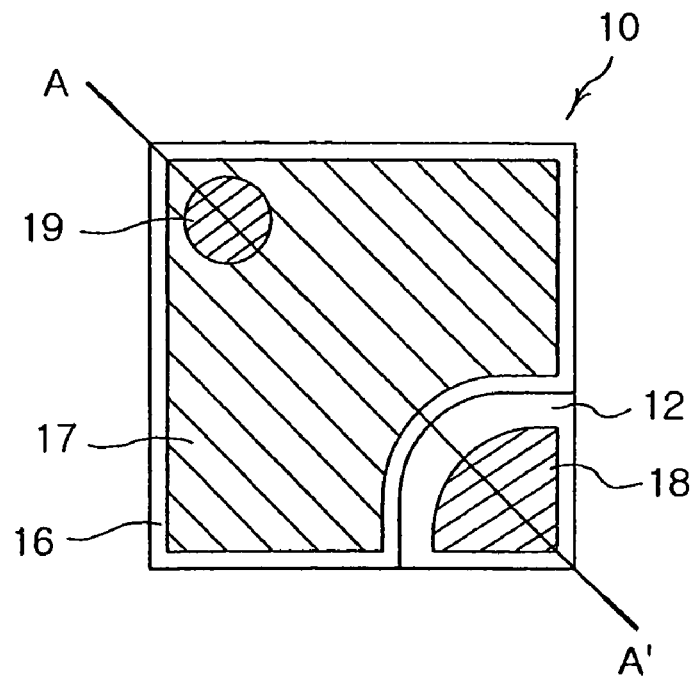
FIGS. 1a and 1b are plan and side sectional views illustrating an example of a conventional nitride semiconductor LED.
Figure 1B:
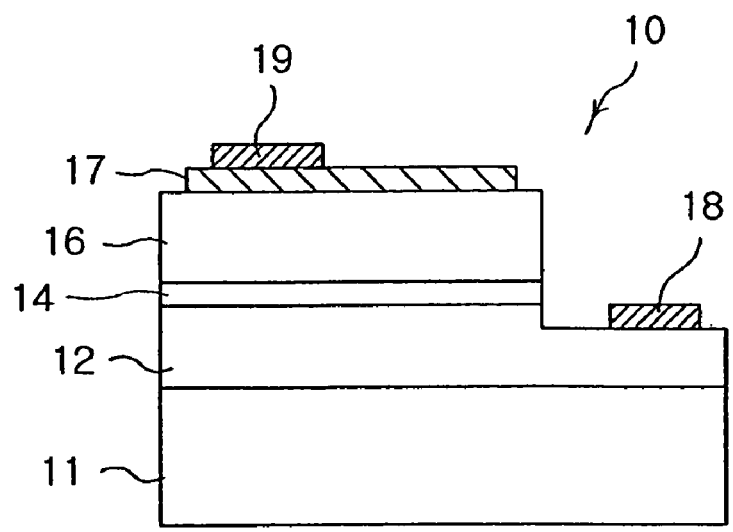
Figure 2:
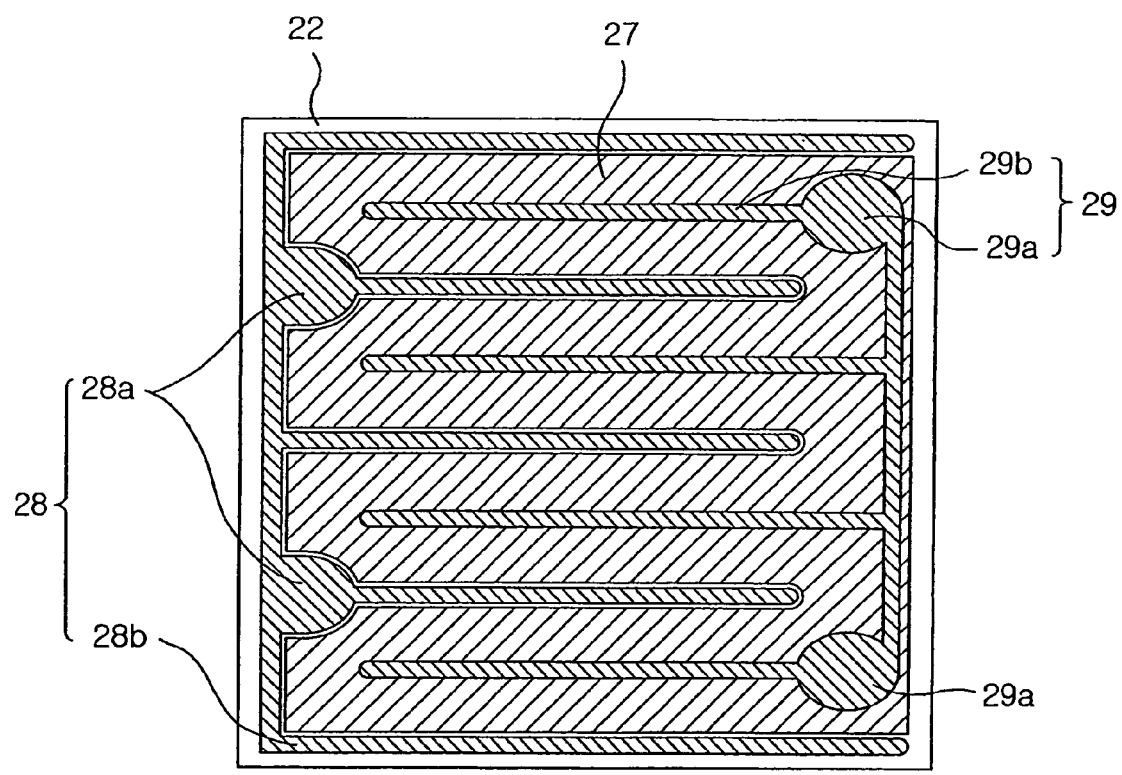
FIG. 2 is a plan view illustrating an example of a conventional nitride semiconductor LED.
Figure 9A:
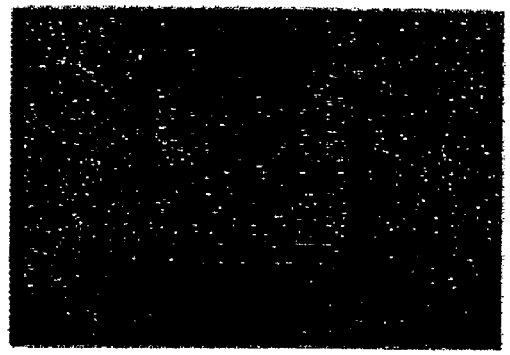
FIGS. 9a to 9c are photographs illustrating conventional nitride semiconductor LEDs together with a nitride semiconductor LED of the invention, respectively.
Figure 9B:

First two of the LED structures were fabricated into the nitride semiconductor LEDs of the electrode structures illustrated in FIGS. 2 and 3a, respectively. The conventional nitride semiconductor LEDs fabricated like this are illustrated in FIGS. 9a and 9b, respectively. The rest of the LED structures was fabricated to have the same electrode structure as in FIG. 8a. The nitride semiconductor LED of the invention fabricated like this is illustrated in FIG. 9c.

Figure 9C:

Although the LED of the invention shown in FIG. 9c has electrode patterns similar to those of the conventional LED shown in FIG. 9b, it has an n-electrode formed on a central area and a p-electrode formed on the upper outer periphery to surround the n-electrode to the contrary of that shown in FIG. 9b.

A predetermined value of voltage was applied to the LEDs shown in FIGS. 9a to 9c through wire bonding on any one of the p- and n-electrode contact pads. Then, the respective LEDs were measured of current to determine their forward voltage characteristics, and then observed of brightness. Resultant forward voltage characteristics and current-brightness characteristics are drawn as graphs in FIGS. 10a and 10b. For reference, characteristics of a conventional nitride semiconductor LED (of 350×350 µm size) are indicated with the reference symbol s together with the high power LEDs for illumination.

Figure 10A:
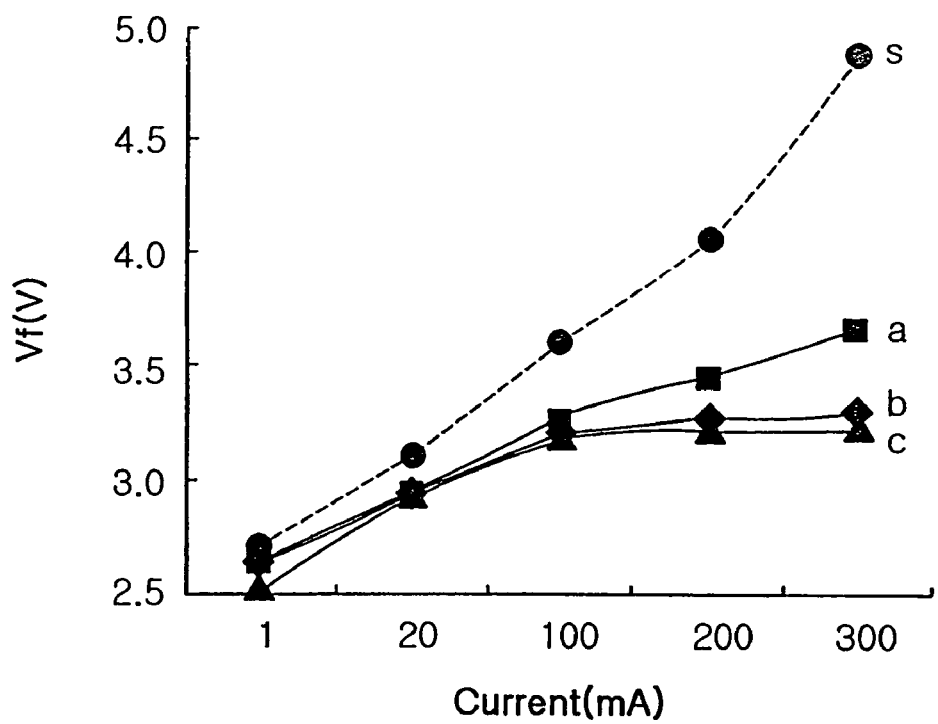
FIGS. 10a and 10b are graphs illustrating forward voltage characteristics and current-brightness characteristics of the nitride semiconductor LEDs in FIGS. 9a to 9c.

First, referring to FIG. 10a, the forward voltage characteristics of the LEDs shown in FIGS. 9a to 9c are indicated with the reference symbols a to c, respectively. From FIG. 10a, it can be understood that the LED in FIG. 9c has more excellent forward voltage characteristics over the conventional LEDs in FIGS. 9a and 9b.

In particular, the LED in FIG. 9c has the electrode structure of substantially same size and similar configuration as the LED in FIG. 9b, but the p- and n-electrodes of the LED in FIG. 9c exchanged their positions with each other from those of the LED in FIG. 9b. According to the result in FIG. 10a, it can be understood that the forward voltage characteristics can be improved by placing the n-electrode inside but the p-electrode around the n-electrode as in the LED in FIG. 9c.

Figure 10B:
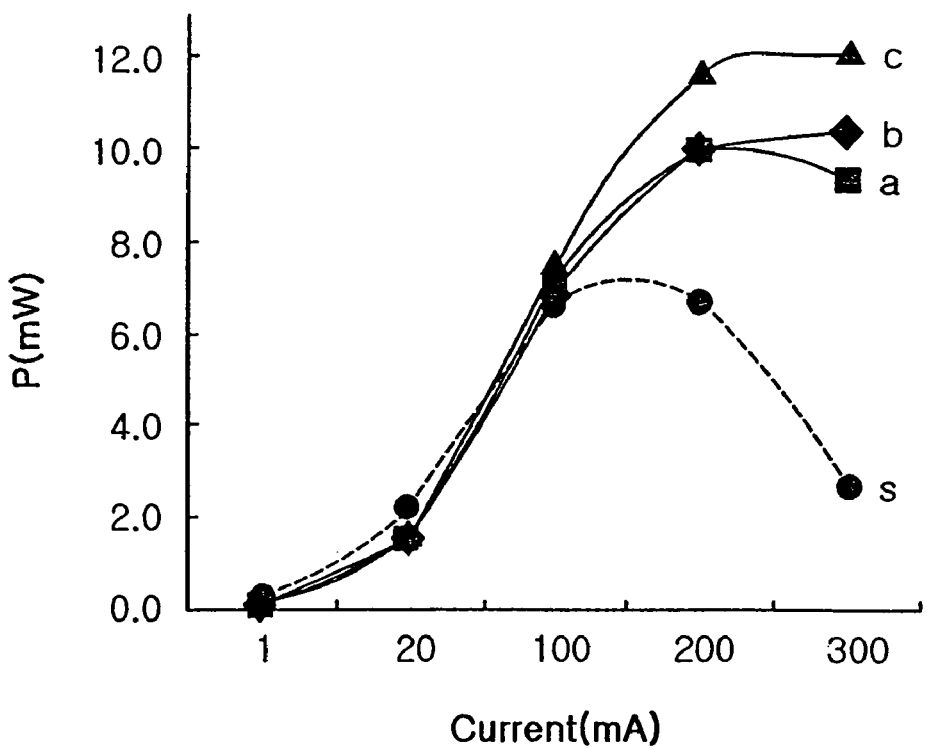
Figure 11A:
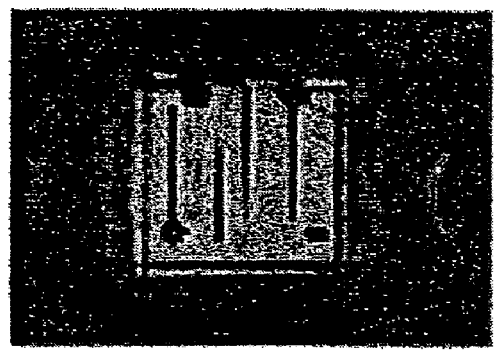
FIGS. 11a to 11c are photographs illustrating the brightness of the nitride semiconductor LEDs in FIGS. 9a to 9c, respectively, at a current of 100 mA.
Figure 11B:
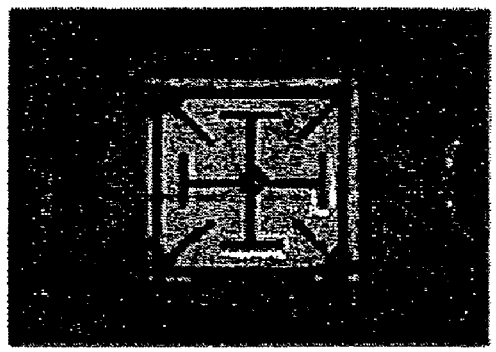
Figure 11C:
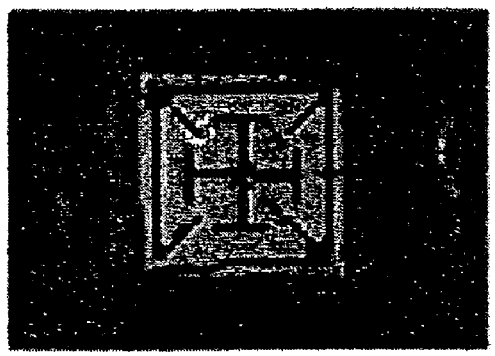
Figure 12A:
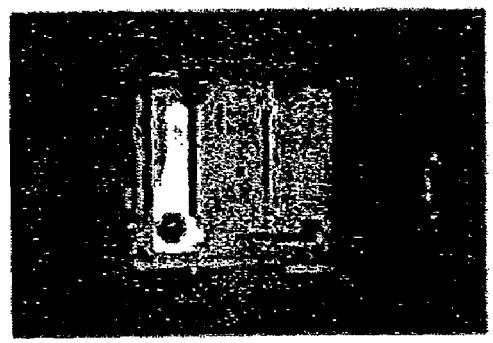
FIGS. 12a to 12c are photographs illustrating the brightness of the nitride semiconductor LEDs in FIGS. 9a to 9c, respectively, at a current of 300 mA.
Figure 12B:
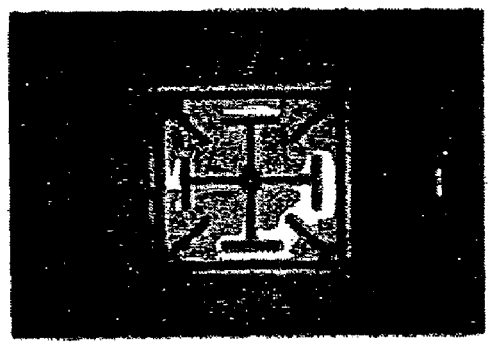
Figure 12C:
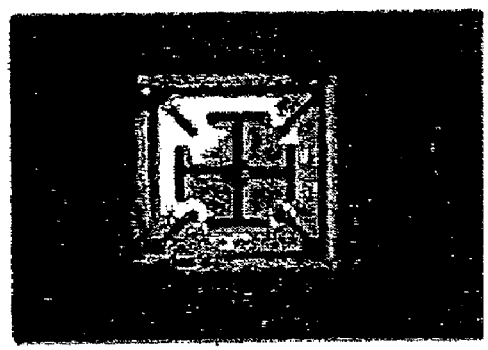

Next, FIG. 10b illustrates optical power variations according to current in the LEDs shown in FIGS. 9a to 9c. As shown in FIG. 10b, it can be understood that the LED in FIG. 9c shows the highest brightness and thus has the most excellent optical power.

In order to compare different optical powers of the nitride semiconductor LEDs in FIGS. 9a to 9c with the naked eye, FIGS. 11a to 11c and FIGS. 12a to 12c illustrate photographs of the nitride semiconductor LEDs operating at currents of 100 mA and 300 mA, respectively. As shown in FIGS. 11a to 11c and FIGS. 12a to 12c, it can be observed that the LEDs in FIGS. 11c and 12c according to the invention show most excellent optical power at the input currents as above.

In particular, the LEDs in FIGS. 9b and 9c show more different optical power characteristics than expectable from different forward voltage characteristics. The improvement in the optical power characteristics was made since the LED in FIG. 9c has a more advantageous geometric configuration for achieving a larger light emitting area than the LED in FIG. 9b.

That is, because the LED as shown in FIG. 9c with the n-electrode being arranged inside can more decrease the area necessary for forming the n-electrode than the LED as shown in FIG. 9b with the n-electrode being arranged along the outer periphery, the LED in FIG. 9c is more advantageous for ensuring a larger light emitting area.

The LED of the invention can be advantageously applied to high power LEDs generally in use for illumination. Although the high power LEDs for illumination can be provided through combination of several small-sized LEDs, they are generally provided as large sized LEDs of at least 1000×1000 µm. The present invention can be more advantageously applied to this type of large-sized high power LEDs. In particular, in case that the LED size is increased in order to ensure higher optical power, contact pads connected to an external power source via connection means such as wires can be further provided to realize uniform current distribution. For example, as shown in FIGS. 6a to 8b, the p-electrode may have two contact pads placed at two opposed corners, or four contact pads at corners. Positions of the plurality of contact pads are not limited to the corners, but the contact pads may be preferably arranged at a uniform spacing.

Similarly, the n-electrode structure can be provided as a plurality of contact pads also in order to realize uniform current distribution in a larger area.

Figure 13A:
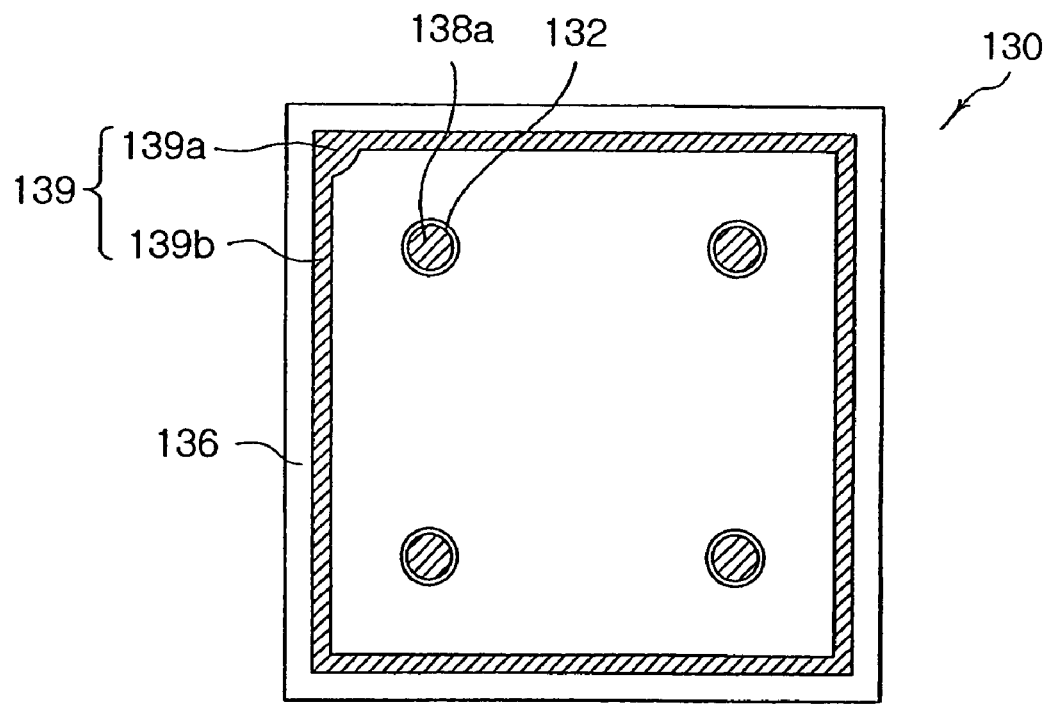
FIGS. 13a to 13c are plan views illustrating nitride semiconductor LEDs having n-electrode structures of a plurality of contact pads, respectively.
Figure 13B:
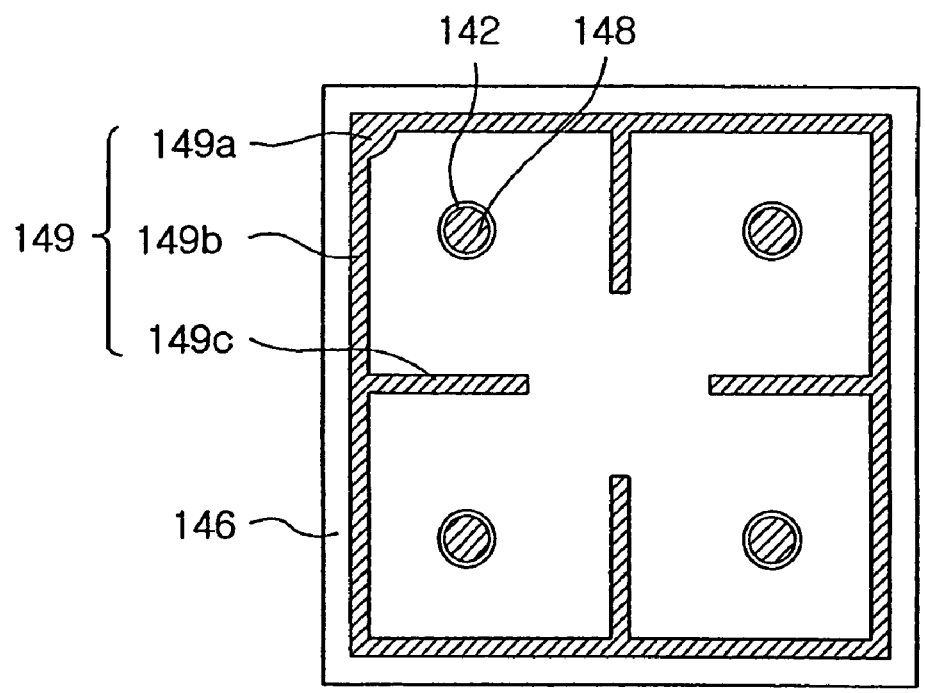
Figure 13C:
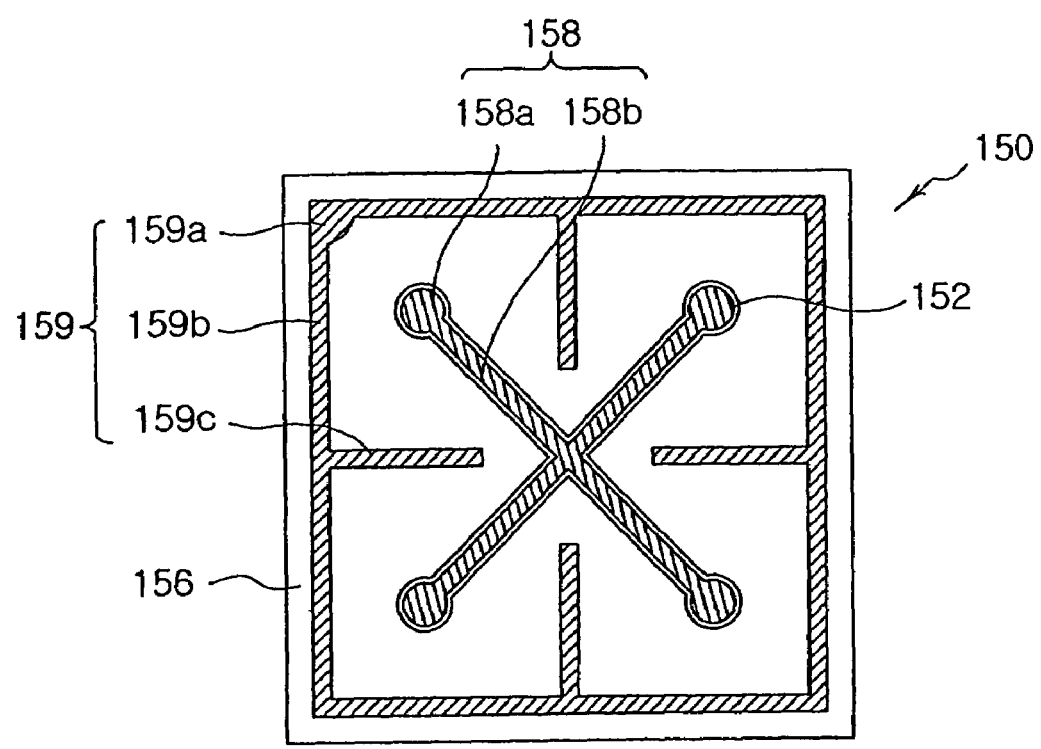

FIGS. 13a to 13c are plan views illustrating nitride semiconductor LEDs having n-electrode structures of a plurality of contact pads, respectively.

In a nitride semiconductor LED 130 shown in FIG. 13a, a p-electrode 139 includes a contact pad 139a formed at a corner and an extension 139b formed along the outer periphery of a p-doped nitride semiconductor layer 136. An n-electrode 132 has four n-electrode contact pads 138a connected to an n-doped nitride semiconductor layer 132. The n-electrode contact pads 138a are formed at central portions of four quarters of the whole light emitting area, respectively, in order to realize uniform current distribution across a large area.

In a nitride semiconductor LED 140 shown in FIG. 13b, an electrode has four n-electrode contact pads 148a connected to an n-nitride semiconductor layer 142 similar to that in FIG. 13a, whereas a p-electrode 149 may have a contact pad 149a formed at a corner, an extension formed along the outer periphery of a p-doped nitride semiconductor layer 146 and four electrode fingers 149c extended from central portions of four sides of the extension into between the n-electrode contact pads.

In a nitride semiconductor LED 150 shown in FIG. 13c, a p-electrode 159 includes a contact pad 159a formed at a corner, an extension 159b formed along the outer periphery of a p-doped nitride semiconductor layer 156 and four electrode fingers 159c extended from central portions of four sides of the extension 159b into between n-electrode contact pads 158*a*. An n-electrode 158 may include the four n-electrode contact pads 158*a* and a crossed extension 158*b* connecting the n-electrode contact pads 158*a* without interference with the p-electrode 159.

The LED of the invention may be modified or varied in forms so that contact pads of each electrode can be suitably increased in number in order to realize sufficient uniform current distribution effect even in large-sized LEDs. In addition to the above modifications obtained by increasing the number of the contact pads, other embodiments may be modified variously while maintaining the basic structure of the invention having an n-electrode arranged inside on the top of a light emitting structure, surrounded by a p-doped nitride semiconductor layer of the light emitting structure, and a p-electrode formed along the upper outer periphery of the p-doped nitride semiconductor layer to surround the n-electrode.

While the present invention has been described with reference to the particular illustrative embodiments and the accompanying drawings, it is not to be limited thereto but will be defined by the appended claims. It is to be appreciated that those skilled in the art can substitute, change or modify the embodiments into various forms without departing from the scope and spirit of the present invention.

As set forth above, the present invention can embody a novel electrode arrangement of an n-electrode formed in an inner area and a p-electrode arranged around the n-electrode to minimize the reduction of an active region from the formation of the n-electrode as well as improve forward voltage characteristics thereby remarkably raising overall luminous efficiency.

What is claimed is:

1. A nitride semiconductor LED, comprising:
   a light emitting structure including an n-doped nitride semiconductor layer having a top surface that comprises a first region and a second region surrounding the first region on a top thereof, an active layer formed on the second region of the n-doped nitride semiconductor layer and a p-doped nitride semiconductor layer formed on the active layer;
   a p-electrode formed on the p-doped nitride semiconductor layer; and
   an n-electrode formed on the first region of the n-doped nitride semiconductor layer;
   wherein the p-electrode has at least one contact pad and at least one extension extending from the contact pad along an outer periphery of the p-doped nitride semiconductor layer.

2. The nitride semiconductor LED according to claim 1, wherein the p-electrode surrounds the n-electrode.

3. The nitride semiconductor LED according to claim 2, wherein the light emitting structure has four corners and four sides each connecting one pair of adjacent corners, and
   wherein the said at least one contact pad is placed adjacent to at least one of the four corners and extension extends from the contact pad along the four sides.

4. The nitride semiconductor LED according to claim 3, wherein the p-electrode further has at least one p-electrode finger extending from at least one of the contact pad and the extension toward the n-electrode.

5. The nitride semiconductor LED according to claim 4, wherein the at least one p-electrode finger comprises four p-electrode fingers which extend from central regions of the four sides, respectively.

6. The nitride semiconductor LED according to claim 4, wherein the at least one p-electrode finger comprises four p-electrode fingers which extend from the four corners, respectively.

7. The nitride semiconductor LED according to claim 4, wherein the p-electrode further has an electrode bar extending in a lateral direction from a terminal of the at least one p-electrode finger a predetermined length.

8. A nitride semiconductor LED, comprising:
   a light emitting structure including an n-doped nitride semiconductor layer having a top surface that comprises a first region and a second region surrounding the first region on a top thereof, an active layer formed on the second region of the n-doped nitride semiconductor layer and a p-doped nitride semiconductor layer formed on the active layer;
   a p-electrode formed on the p-doped nitride semiconductor layer; and
   an n-electrode formed on the first region of the n-doped nitride semiconductor layer;
   wherein the n-electrode includes a contact pad formed on a substantially central area of the n-doped nitride semiconductor layer and at least one n-electrode finger extending outward from the contact pad on the n-doped nitride semiconductor layer.

9. The nitride semiconductor LED according to claim 8, wherein the p-electrode includes at least one contact pad and at least one extension extending from the contact pad along an outer periphery on the p-doped nitride semiconductor layer.

10. The nitride semiconductor LED according to claim 9, wherein the p-electrode surrounds the n-electrode.

11. The nitride semiconductor LED according to claim 10, wherein the p-electrode further includes at least one p-electrode finger extending from at least one of the contact pad and the extension toward the n-electrode.

12. The nitride semiconductor LED according to claim 8, wherein the light emitting structure has four corners and four sides each connecting one pair of adjacent corners, and
    wherein the at least one n-electrode finger comprises four n-electrode fingers extending toward the four corners, respectively.

13. The nitride semiconductor LED according to claim 12, wherein the p-electrode includes at least one contact pad, at least one extension extending from the contact pad along an outer periphery of the p-doped nitride semiconductor layer to surround the n-electrode and four p-electrode fingers extending from central portions of the four sides toward the contact pad of the n-electrode.

14. The nitride semiconductor LED according to claim 8, wherein the light emitting structure has four corners and four sides each connecting one pair of adjacent corners, and
    the at least one n-electrode finger comprises four e-electrode fingers which extend toward central portions of the four sides, respectively.

15. The nitride semiconductor LED according to claim 14, wherein the p-electrode includes at least one contact pad, at least one extension extending from the contact pad along an outer periphery of the p-doped nitride semiconductor layer to surround the n-electrode, and four p-electrode fingers extend from the four corners toward the contact pad of the n-electrode.

16. The nitride semiconductor LED according to claim 8, wherein the n-electrode further has an electrode bar extending in a lateral direction at a terminal of the at least one n-electrode finger a predetermined length.

17. A nitride semiconductor LED, comprising:
a light emitting structure including an n-doped nitride semiconductor layer, an active layer on top of the n-doped nitride semiconductor layer and a p-doped nitride semiconductor layer on top of the active layer;
a p-electrode including at least one contact pad formed in a first area on the p-doped nitride semiconductor layer and an extension extending from the contact pad along an outer periphery on the n-doped nitride semiconductor layer; and
an n-electrode including at least one contact pad formed in a second area on the n-doped nitride semiconductor layer, said second area being surrounded by the p-electrode.

18. The nitride semiconductor LED according to claim 17, wherein the second area on the n-doped nitride semiconductor layer is divided into a plurality of equally-sized sub-areas, and the at least one contact pad of the n-electrode comprises a plurality of contact pads which ate arranged in substantially central portions of the sub-areas, respectively.

19. The nitride semiconductor LED according to claim 18, wherein the n-electrode further includes an extension extend between the contact pads of the n-electrode and/or from the contact pads of the n-electrode toward the p-electrode.

20. The nitride semiconductor LED according to claim 19, wherein the extension of the n-electrode connects at least some of the n-electrode contact pads of the n-electrode together.

* * * * *